United States Patent [19]

Matsuzaki et al.

[11] Patent Number: 4,617,653
[45] Date of Patent: Oct. 14, 1986

[54] SEMICONDUCTOR MEMORY DEVICE UTILIZING MULTI-STAGE DECODING

[75] Inventors: Yasuro Matsuzaki, Tama; Toshitaka Fukushima, Yokohama; Kouji Ueno, Kawasaki, all of Japan

[73] Assignee: Fujitsu Limited, Kawasaki, Japan

[21] Appl. No.: 566,323

[22] Filed: Dec. 28, 1983

[30] Foreign Application Priority Data

Dec. 29, 1982 [JP] Japan ................................ 57-233906

[51] Int. Cl.$^4$ ........................ G11C 8/00; G11C 11/36
[52] U.S. Cl. .................................... 365/230; 365/179; 307/449
[58] Field of Search ............. 365/230, 174, 227, 179; 307/467, 463, 449

[56] References Cited

U.S. PATENT DOCUMENTS 4,369,503 1/1983 Isogai .................................. 365/230
4,385,370 5/1983 Isogai .................................. 365/230

FOREIGN PATENT DOCUMENTS 0054853 6/1982 European Pat. Off. .......... 365/230

Primary Examiner—James W. Moffitt
Assistant Examiner—Glenn A. Gossage
Attorney, Agent, or Firm—Staas & Halsey

[57] ABSTRACT

A semiconductor memory device includes a plurality of memory cells arranged in a matrix form and a decoder circuit selecting a row of the matrix in response to an address signal. The decoder circuit includes a first-stage decoder having a plurality of first-stage decoding elements and a second-stage decoder having a plurality of second-stage decoding elements. Each first-stage decoding element is connected to a plurality of second-stage decoding elements. Each of the first-stage decoding elements receives predetermined higher bits of the address signals. One of the first-stage decoding elements is selected upon one access command. Each of the plurality of second-stage decoding elements receives the address signals. One of the rows of the matrix is selected in response to the the address signals when the corresponding first-stage decoding element operates, whereby the power consumption is reduced.

16 Claims, 10 Drawing Figures

SEMICONDUCTOR MEMORY DEVICE UTILIZING MULTI-STAGE DECODING

BACKGROUND OF THE INVENTION

1. Field of the Invention

The present invention relates to a semiconductor memory device, more particularly to a semiconductor memory device having reduced power consumption.

2. Description of the Prior Art

As is well known, a semiconductor memory device includes a plurality of memory cells arranged in a matrix form, a decoder circuit, a multiplexer circuit, a group of word lines connected to the decoder circuit to activate one of the rows of the matrix, and a group of bit lines connected to the multiplexer circuit to activate one of the columns of the matrix. When a memory system requires a memory capacity over that of a single memory device, two or more memory devices are provided in parallel.

The conventional technique for reducing power consumption of a memory system is to provide a switching circuit outside each memory device. The switching circuit is connected to the power supply terminal of the memory device. Using the switching circuit, it is possible to supply power only to the memory device which is to be accessed, i.e., power is not supplied to other memory devices.

This method, however, is disadvantageous in that the switching time for the switching circuit outside of the memory device increases in memory access time.

Also, this method is rapidly losing its effectiveness in the face of the recent increases in memory capacities of individual memory devices, now 64K bits or 128K bits, which result in increases in the size of the memory devices. It is no longer sufficient to reduce the power consumption of the memory device by switching off power to nonaccessed memory circuits.

SUMMARY OF THE INVENTION

An object of the present invention is to provide a semiconductor memory device having reduced power consumption.

Another object of the present invention is to provide a semiconductor memory device having a reduced power consumption and an improved access time.

According to the present invention, there is provided a semiconductor memory device including a plurality of memory cells arranged in a matrix and a decoder means for selecting one row of the matrix in response to a plurality of address signals. The decoder means includes a first-stage decoder having a plurality of first-stage decoding elements and a second-stage decoder having a plurality of second stage decoding elements. Each of the first-stage decoding elements is connected to a plurality of second-stage decoding elements. Each of the second-stage decoding elements receive the plurality of address signals. Each of the first-stage decoding elements receive a part of the plurality of address signals.

BRIEF DESCRIPTION OF THE DRAWINGS

Other objects and features of the present invention will be clearly understood with reference to the accompanying drawings, in which.

DESCRIPTION OF THE PREFERRED EMBODIMENTS

Before describing a preferred embodiment of the present invention, an explanation will be given with reference to the prior art.

Figure 1:
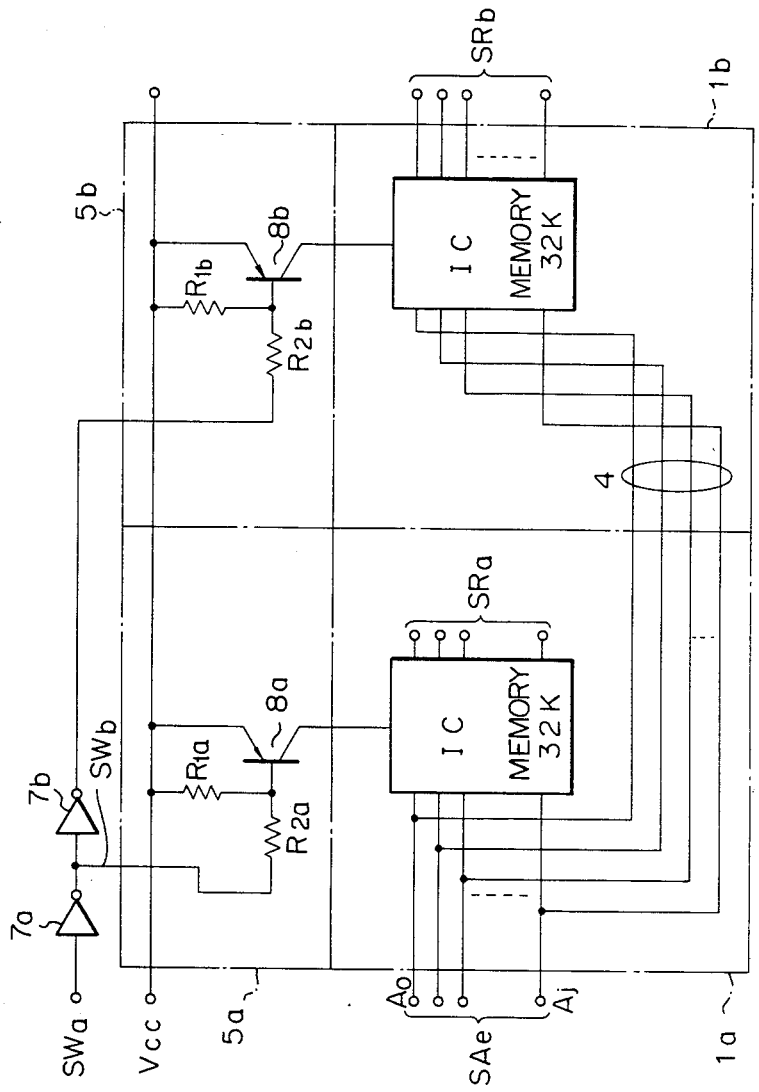
FIG. 1 is a circuit diagram of a prior art memory system including two memory devices arranged in parallel and two external switching circuits connected to the memory devices.

FIG. 1 is a prior art circit of a memory system including two integrated semiconductor circuit (IC) memory devices provided in parallel. In FIG. 1, the IC memory devices $1a$ and $1b$ have, for example, 32K bit capacities, and are arranged in parallel through the line 4. This memory system therefore has a 64K bit capacity. When the input terminals at the IC memory devices $1a$ and/or $1b$ receive an external address signal SAe, consisting of $A_o$ through $A_j$ binary signals, the content stored in the accessed memory cell is output as the read signal $SR_a$ and/or $SR_b$.

In order to reduce the power consumption, the memory devices $1a$ and $1b$ are externally provided with power switching circuits $5a$ and $5b$. A switching signal $SW_a$ is applied to an inverter $7a$, so as to generate a reversed signal $SW_b$, and is reversed again by an inverter $7b$. The switching signals $SW_a$ and $SW_b$ are applied to the bases of power switching pnp transistors $8a$ and $8b$ in the power switching circuits $5a$ and $5b$ through bias resistors $R2a$ and $R2b$, respectively. The emitters of the transistors $8a$ and $8b$ are connected to a power line Vcc, and the collectors are connected to the memory devices $1a$ and $1b$, respectively. Therefore, in this example, one of the memory devices is activated in response to the switching signal SWa or SWb Resistors R1$a$ and R1$b$ are also bias resistors.

Figure 2:
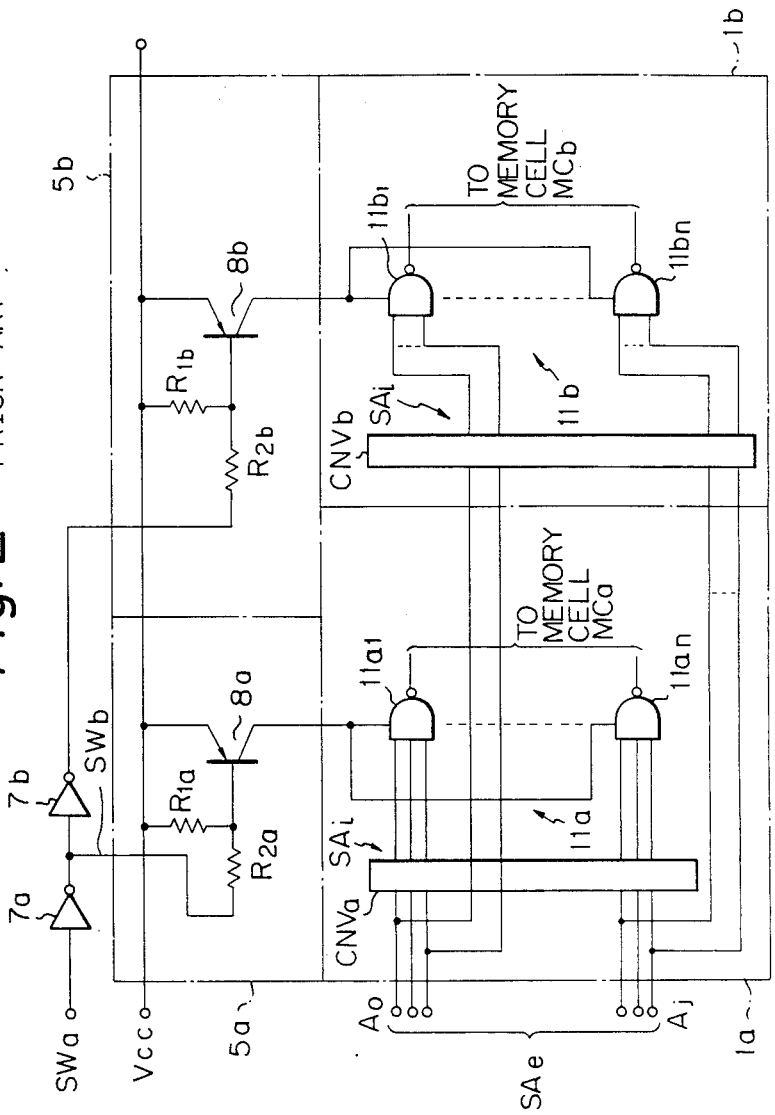
FIG. 2 is a circuit diagram of the external switching circuits and the decoder circuits in the memory devices shown in FIG. 1.

FIG. 2 is a circuit diagram of the connection of the power switching circuits $5a$ and $5b$ and decoder circuits $11a$ and $11b$, represented as logic gates. The IC memory devices $1a$ and $1b$ include memory cells, control circuits, etc, however, only address converter circuits $CNV_a$ and $CNV_b$ and decoder circuits $11a$ and $11b$ are shown in FIG. 2. The decoder circuit $11a$ consists of NAND gates $11_{a1}$ through $11_{an}$, while the decoder circuit $11b$ consists of NAND gates $11_{b1}$ through $11_{bn}$. Each of the NAND gates $11_{a1}$ through $11_{an}$ and $11_{b1}$ through $11_{bn}$ receive the internal address signal SAi, converted from the external address signal SAe by the address converting circuits $CNV_a$ and $CNV_b$, and outputs a word line activation signal corresponding to one of the memory cells of the memory cells MCa and MCb in the memory devices 1a and 1b.

Generally, the power consumption of the decoder circuit of a memory is approximately one-third to one-half of the total power consumption of the memory device.

In the prior art memory system which includes two-stage decoder circuits, i.e., a first stage consisting of the power switching circuits 5a and 5b externally connected to the memory devices 1a and 1b and a second stage consisting of the decoder circuit 11a and 11b in the memory devices 1a and 1b, only one of the decoder circuits 11a and 11b operates at the same time. This means the power consumption caused by the decoder circuits 11a and 11b is reduced by half. As mentioned earlier, however, there are disadvantages in that the power consumption cannot be reduced if the two memory devices are accessed at the same time, the access time increases due to the operation time of the power switching transistors 8a and 8b and the requisite decoder circuit stabilizing time, and the external connection of the switching circuit to the memory device does not give sufficient power reduction for large memory devices.

Embodiments of the present invention will now be explained below.

Figure 3:
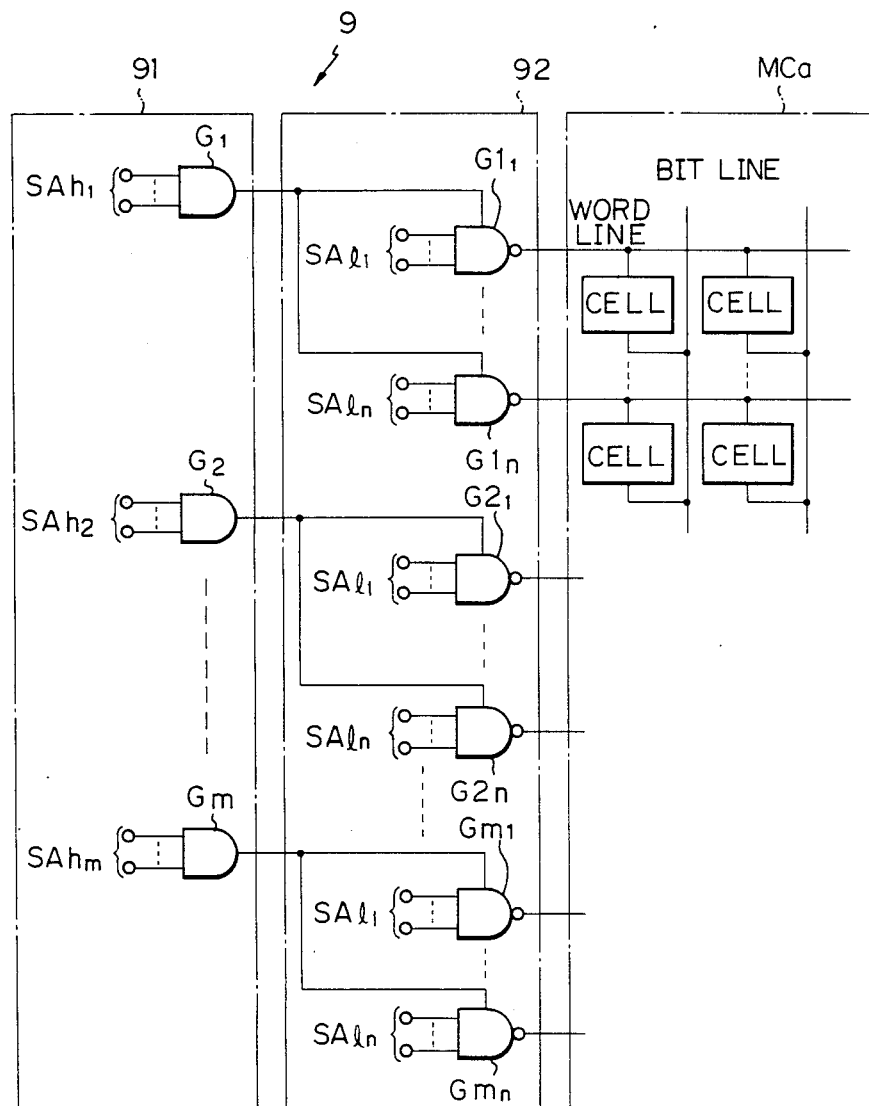
FIG. 3 is a block diagram of a memory device in accordance with the present invention.

FIG. 3 is a block diagram of a memory device, for example, an IC memory device 1a, in accordance with the present invention. In FIG. 3, the memory device includes a decoder circuit 9 comprising a first-stage decoder 91 and a second-stage decoder 92, a plurality of semiconductor memory cells MCa for storing information, a group of word lines connected to the second-stage decoder 92, and a group of bit lines connected to a multiplexer (not shown). The first-stage decoder 91 consists of a plurality of AND gates $G_1$ through $G_m$ (m is an integer). The second-stage decoder 92 comprises a plurality of NAND gate groups $G1_1$ to $G1_n$, $G2_1$ to $G2_n$, - - -, $Gm_1$ to $Gm_n$ (n is an integer), each group being activated by one of the gates of the first-stage decoder 91, as shown in FIG. 3.

Each set of a first-stage decoder gate and a corresponding group of second-stage decoder gates, for example, the gate $G_1$ and the gates $G1_1$ to $G1_n$, defines a predetermined range of word lines.

In the decoder circuit 9 shown in FIG. 3, the gate $G_1$ corresponds to the power switching circuit 5a in FIG. 2 and the gates $G1_1$ to $G1_n$ to the decoder circuit 11a in FIG. 2. There are, however, substantial differences between the two constructions, i.e., (a) first-stage decoder 91 is built into the memory device, (b) the first-stage decoder 91 comprises of a plurality of gates $G_1$ to $G_m$, (c) each of the gates $G_1$ to $G_m$ activates a group of gates in the second-stage decoder 92 connected thereto, and (d) only one set of a first-stage decoder gate and a corresponding second-stage decoder can operate in response to an address signal upon an access command.

Figure 4:
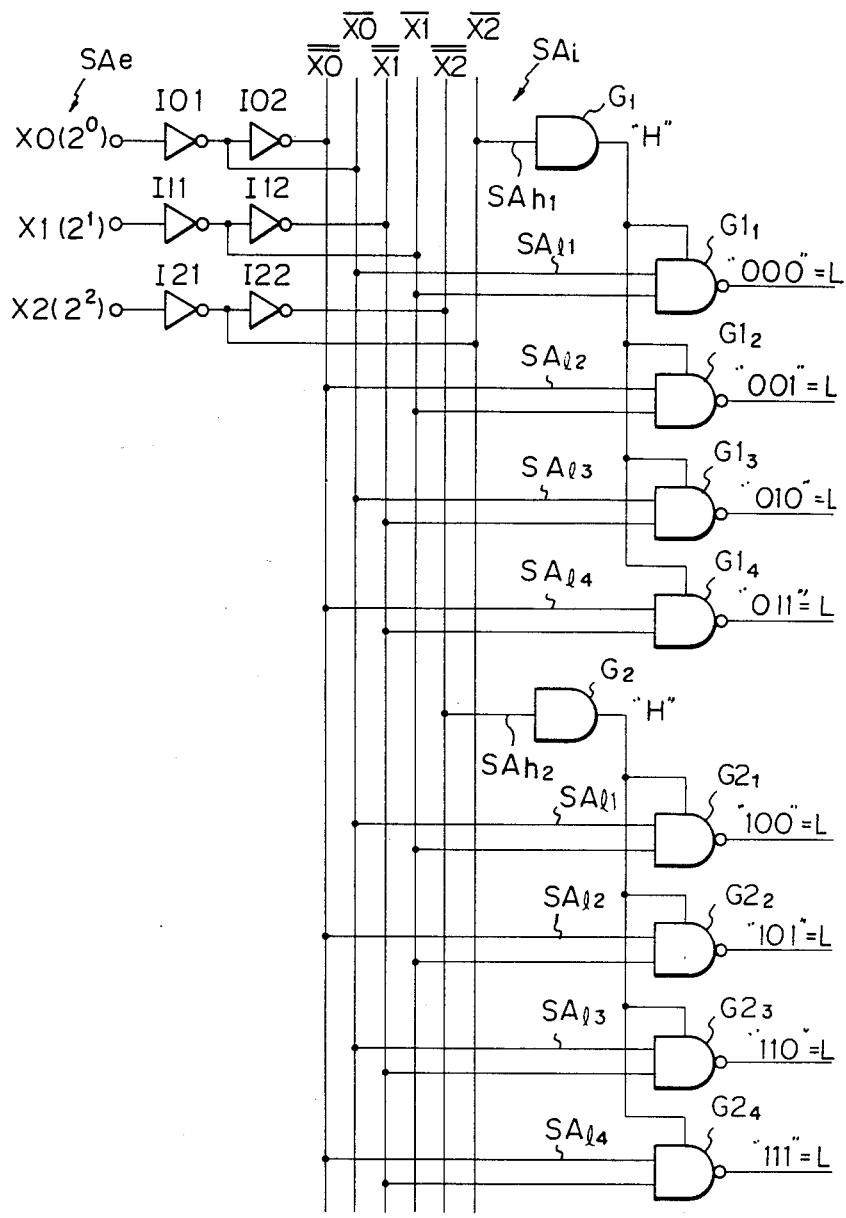
FIG. 4 is a circuit diagram of a circuit connected to the decoder circuit of FIG. 3, for converting an external address signal to an internal address signal.

FIG. 4 is a circuit diagram for a circuit, for converting the external address signal SAe into the internal address signal SAi, connected to the first and second-stage decoder gates. In this example, the external address signal SAe comprises three binary bits, i.e., X0 representing $2^0$, X1 representing $2^1$, and X2 representing $2^2$. The range of the external address signal SAe is 0 to 7, as shown in Table 1.

TABLE 1

| $S2_I$ | $S2_E$ | | |
|---|---|---|---|
| | X2 | X1 | X0 |
| 0 | 0 | 0 | 0 |
| 1 | 0 | 0 | 1 |
| 2 | 0 | 1 | 0 |
| 3 | 0 | 1 | 1 |
| 4 | 1 | 0 | 0 |
| 5 | 1 | 0 | 1 |
| 6 | 1 | 1 | 0 |
| 7 | 1 | 1 | 1 |

In order to convert the external address signal SAe to the internal address signal SAi, two series inverters I01 and I02 are provided on the X0 bit line, I11 and I12 on the X1 bit line, and I21 and I22 on the X2 bit line. Thus, inverted signals $\overline{X0}$ to $\overline{X2}$ and reinverted (non-inverted signals) X0 to X2 are generated.

In this example, the first-stage decoder 91 has two (m=2) gates, and the second-stage decoder 92 has eight ((n=4)×2) gates. Therefore, the internal address signal SAi, which can be generated by the combination of any inverted and reinverted signals, is connected to gates $G_1$ and $G_2$, which are "high (H)" level when they supply power to the corresponding decoder gates, and is connected to gates $G1_1$ to $G1_4$ and $G2_1$ to $G2_4$, which are "low (L)" level when one of them activates the corresponding word line.

As can be understood from the above description in general, the higher bits $SA_{h1}$ to $SA_{hm}$ (or bit groups) of the internal address signals are connected to the first-stage decoder 91 so as to operate one of the gates $G_1$ to $G_m$. The lower bits (or bit groups) $SA_{l1}$ to $Sa_{ln}$ of the internal address signal are connected to the second-stage decoder 92. The internal address signal SAi is connected to each group of gates of the second-stage decoder 92 in the same way. Therefore, for example, the connections of the internal address signal SAi to gates $G1_1$, $G2_1$, ..., $Gm_n$ are the same.

In the embodiment shown in FIGS. 3 and 4, only one set of a first-stage decoder gate and corresponding second-stage decoder gates, for example, the set of gate $G_1$ and gates $G1_1$ to $G1_n$, is operated in response to an access command. The other sets are not operated. Therefore, only one set of gates consumes power in the decoder circuit 9. To obtain the minimum power consumption of the decoder circuit 9, the optimal division or distribution of the gates of the first-stage decoder 91 and the corresponding gates of the second-stage decoder 92 should be considered.

Figure 5:
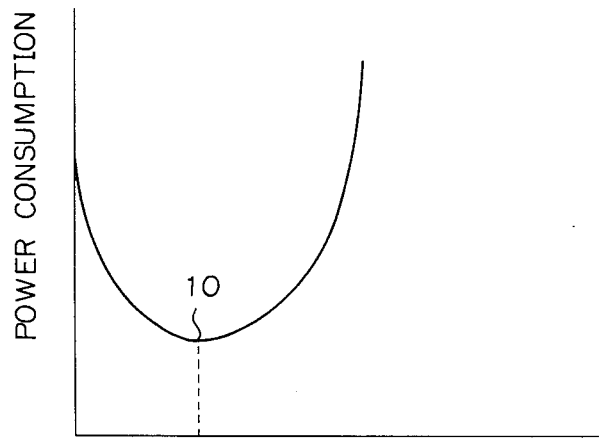
FIG. 5 is a graph of the general relationship between the number of first-stage decoding gates and the power consumption of the decoder circuit in accordance with the present invention.

FIG. 5 is a graph of the relationship between the number of gates in the first-stage decoder 91 (horizontal axis) and the power consumption of decoder circuit 9 (vertical axis). The curve shows that minimum power consumption is achieved with 10 gates. This will be explained later in detail.

Figure 6:
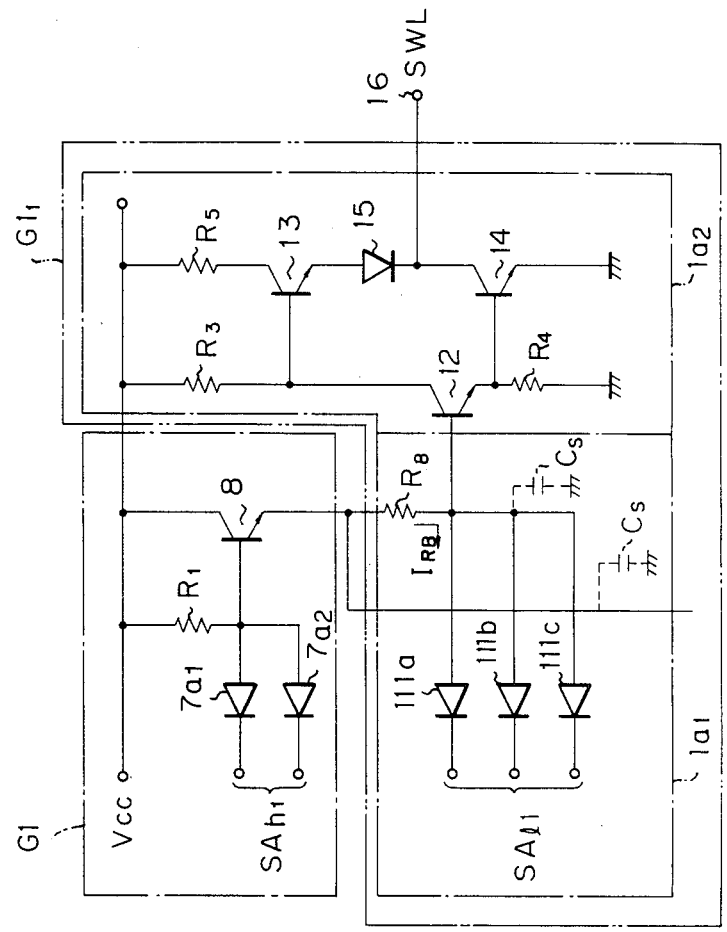
FIG. 6 is a circuit diagram of an embodiment of the decoder circuit shown in FIG. 3.

FIG. 6 is a detailed circuit diagram of the first-stage decoder gate $G_1$ and the second-stage decoder gate $G1_1$ shown in FIG. 3. The gate $G_1$ includes a power switching transistor 8, a bias resistor R1, and diodes $7_{a1}$ and $7_{a2}$ connected in parallel. The collector of the transistor 8 is connected to the power line Vcc, and the base is connected to the connection point of the anodes of the diodes $7_{a1}$ and $7_{a2}$ and the resistor R1. The emitter of the transistor 8 is connected to the corresponding gate $G1_1$.

In this embodiment, the gate $G1_1$ comprises an AND gate portion $1_{a1}$ and an inverter portion $1_{a2}$. The AND gate portion $1_{a1}$ includes diodes 111a to 111c connected in parallel and a bias resistor $R_B$. The inverter portion $1_{a2}$ includes transistors 12 to 14, resistors R3 to R5, and a diode 15. The base of the transistor 12 is connected to the connection point of the anodes of the diodes 111a to 111c and the resistor $R_8$; the collector is connected to the power line Vcc through the resistor R3; and the emitter is grounded through the resistor R4. The emitter of the transistor 12 is also connected to the base of the transistor 14, and the collector is connected to the base of the transistor 13. The transistors 13 and 14 are connected in series through the diode 15. The collector of the transistor 13 is connected to the power line Vcc through the resistor R5, and the emitter is connected to the anode of the diode 15. The collector of the transistor 14 is connected to the cathode of the diode 15, and the emitter is grounded.

The word-line activation signal SWL is output at the terminal 16 which is connected to the collector of the transistor 14.

In this embodiment, the higher bits $SA_{h1}$ of the internal address signal, in this case two bits, are applied to the cathodes of the diodes 7a1 and 7a2, and the lower bits $SA_{l1}$ of the internal address signal, in this case three bits, are applied to the cathodes of the diodes 111a to 111c. The diodes 7a1 and 7a2 form an AND gate. The diodes 111a to 111c also form an AND gate.

Comparing the gate $G_1$ in FIG. 6 with the power switching circuit 5a in FIG. 1, the transistor 8 in the gate $G_1$ is an npn-type transistor instead of the pnp-transistor 8a. There is the distinctive merit that an npn-type transistor can be produced as a so-called "vertical" type transistor where a n-type epitaxial growth layer is formed on a p-type substrate. Therefore, an npn-type transistor has a high-frequency characteristic and a higher amplification factor compared with a pnp-type transistor. The memory device formed by the npn-type transistor of the present invention can provide a higher speed decoding operation and a better power switching operation than the prior memory system. Also the production process of an npn-type transistor is simpler than that of a pnp-type transistor.

The above-mentioned merits also apply to the npn-type transistors 12 to 14 in the gate $G1_1$ shown in FIG. 6.

The operation of the circuit shown in FIG. 6 will be described below. When all of the higher bits $SA_{h1}$ of the internal address signal, applied to the cathodes of the diodes 7a1 and 7a2 in the gate $G_1$, are the high level ("H"), the npn transistor 8 is turned on. In addition, when all of the lower bits $SA_{l1}$ of the internal address signal, applied to the cathodes of the diodes 111a to 111c provided in the AND gate portion $1a_1$, are the high level, the transistors 12 and 14 are turned on, whereby a low-level ("L") word line signal is output at the terminal 16.

When the transistor 8 is kept in the on state, however, one of the lower bits $SA_{l1}$ of the internal address signal applied to the diodes 111a to 111c is the low level, whereby almost all of the emitter current of the transistor 8 flows to one of the diodes 111a to 111c. The base of the first transistor 12 in the inverter portion $1_{a2}$ receives the bias voltage and the transistor 12 is turned on, however, a small emitter current of the transistor 12 flows to ground through the resistor R4. Consequently, the third transistor 14 cannot be turned on, and the output signal SWL at the terminal 16 is the high level, which means non-selection of the word line.

When the transistor 8 in the gate $G_1$ is in the off state, the first and third transistors 12 and 14 are also off.

As can be understood from the above explanation, when the gate of the first-stage decoder is not in operation, the power consumption of the set of the first-stage decoder gate and the corresponding second-stage decoder gates is almost zero. Only one set of a first-stage decoder gate and corresponding second-stage decoder gates in the memory device is powered upon receipt of an access command. In addition, when one set is activated, only the first-stage decoder gate and one of the second-stage decoder gates are powered. The other second-stage decoder gates are not powered. This means a considerable reduction in the power consumption of the decoder circuit.

In the circuit in FIG. 6, use of Schottky barrier diodes for the diodes 7a1 and 7a2 and the diodes 111a to 111c will reduce the operation time of the decoder circuit in accordance with the high-speed characteristics of the Schottky diodes.

The above AND circuits which include the diodes 7a1 and 7a2 and 111a to 111c can be replaced with an NAND circuit.

Now, in the circuit in FIG. 6, the higher bits of the internal address signal applied to the diodes 7a1 and 7a2 in the first-stage decoder gate $G_1$ and the lower bits of the internal address signal applied to the diodes 111a to 111c of the AND portion $1_{a1}$ in the second-stage decoder gate $G1_1$, are split. Accordingly, a stray capacitance $C_S$ may be caused between the anodes of the diodes 111a to 111c and ground, i.e., between the base and ground of the transistor 12, whereby too long a time period occurs after the transistor 8 turns off until the first transistor 12 in the inverter portion $1_{a2}$ turns off, due to the time constant of the capacitance $C_S$ and the resistor $R_8$. If the resistance of the resistor $R_8$ is large, the time for discharging the charge stored in the capacitance $C_S$, while the transistor 8 is turning on, becomes too long.

Figure 7:
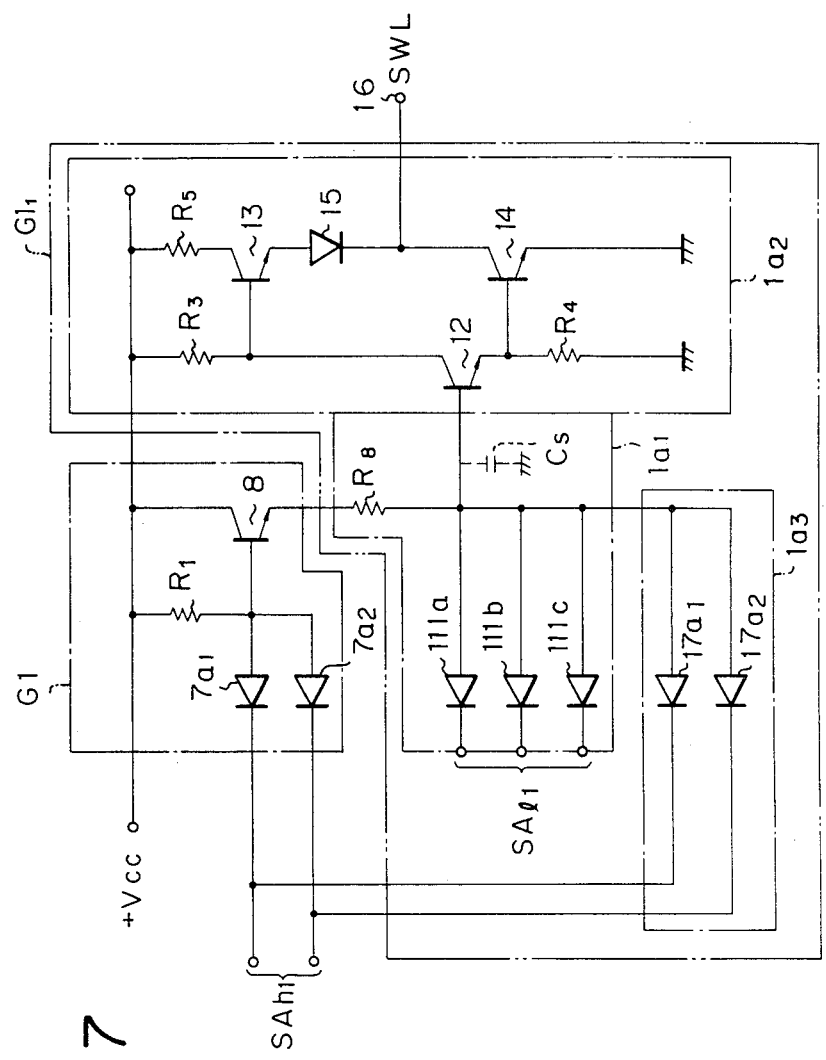
FIG. 7 is a circuit diagram of another embodiment of the decoder circuit shown in FIG. 3.

FIG. 7 shows another embodiment of the present invention in which this situation is improved. The circuit shown in FIG. 7 has an additional AND portion $1_{a3}$ comprising diodes $17_{a1}$ and $17_{a2}$ connected in parallel to make an AND gate. The cathodes of the diodes $17_{a1}$ and $17_{a2}$ receive the higher bits of the internal address signal as do the cathodes of the diodes $7_{a1}$ and $7_{a2}$. The anodes are connected together and connected to the connection point of the anodes of the diodes 111a to 111c, the resistor $R_B$, and the base of transistor 12.

In accordance with the circuit shown in FIG. 7, the charge stored in the stray capacitance $C_S$ formed between the base of the transistor 12 and ground is discharged through the diodes $17_{a1}$ and $17_{a2}$.

Figure 8:
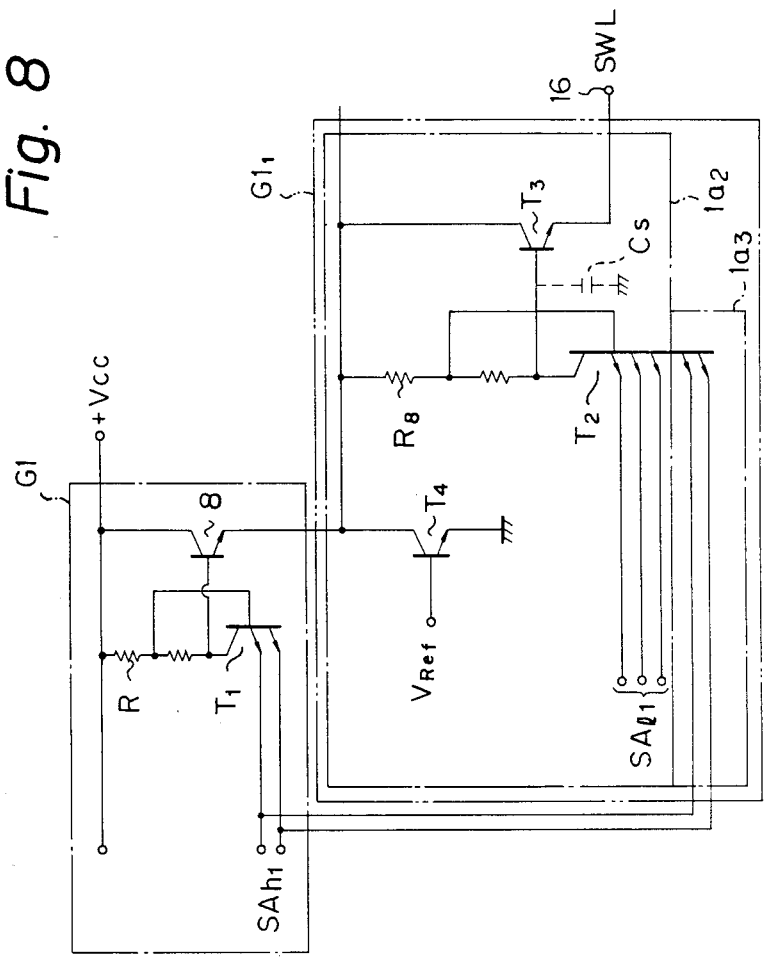
FIG. 8 is a circuit diagram of still another embodiment of the decoder circit shown in FIG. 3.

FIG. 8 shows another embodiment of the decoder circuit. In this circuit, the operation time of the decoder circuit is improved by using emitter-coupled-logic (ECL) technology. The first-stage decoder gate $G_1$ comprises a power switching transistor 8 similar to that of FIGS. 6 and 7 and a multi-emitter transistor $T_1$ instead of the diodes $7_{a1}$ and $7_{a2}$. The higher bits of the internal address signal are applied to the emitters of the transistor $T_1$. The second-stage decoder gate $G1_1$ includes transistors $T_4$ and $T_3$, a multi-emitter transistor $T_2$, and a resistor $R_B$. The higher and lower bits of the internal address signal are applied to the emitters of the transistor $T_2$ in the same manner as in FIG. 7. The base of the transistor $T_4$ receives a reference voltage $V_{ref}$, the collector is connected to the emitter of transistor 8, and the emitter is grounded. The emitter of transistor 8 is also connected to the base of the transistor T$_3$ and the collector of the multi-emitter transistor T$_2$ through the resistor R$_8$.

The base principle of operation of this circuit is similar to that of the circuit shown in FIG. 7. Accordingly, the explanation of this circuit operation is omitted.

Determination of the number of gates of the first-stage and second-stage decoders for the minimum power consumption of the decoder circuit will be explained below with reference to the circuit shown in FIG. 3.

First, the number (m) of gates of the first-stage decoder 91 for minimizing the current of the second-stage decoder gates GX$_1$ to GX$_n$ (X is an arbitrary number of 1 to m) will be considered.

The overall decoder driver-circuit current IDD is defined as follows:

$$IDD = I_1 + I_3(2^{n-m} - 1)I_4 + (2^m - 1)I_2 + (2^n - 2^{n-m})I_5 \quad (1)$$

where,
- m: number of gates of the first-stage decoder;
- n: number of gates of the second-stage decoder;
- I$_1$: current flowing in the selected gate of the first-stage decoder and not supplied to the gates of the second-stage decoder (only the current consumed by the gate of the first-stage decoder and not that supplied from the gate of the first-stage decoder to the gates of the second-stage decoder);
- I$_2$: current flowing in the non-selected gates of the first-stage decoder;
- I$_3$: current flowing in the selected gates of the second-stage decoder;
- I$_4$: current flowing in the non-selected gates of the second stage decoder connected to the selected gate of the first-stage decoder; and
- I$_5$: current flowing in the non-selected gates of the first-stage decoder.

The currents I$_1$ to I$_5$ are determined by the resistance of the resistors in the circuit and do not depend on the numbers m and n.

Rewriting the notations $2^n$ and $2^m$ as N and M in equation (1), one obtains:

$$IDD = I_1 + I_3 + \left(\frac{N}{M} - 1\right)I_4 + (M - 1)I_2 + \left(N - \frac{N}{M}\right)I_5$$

Rewriting the above equation, one obtains:

$$IDD = (I_4 - I_5)\frac{N}{M} + MI_2 + NI_5 + (I_1 + I_3 - I_2 - I_4) \quad (2)$$

The currents I$_1$ to I$_5$ and N are constant.

Differentiating equation (2) with respect to M, one obtains:

$$\frac{dIDD}{dM} = -(I_4 - I_5)\frac{N}{M^2} + I_2 \quad (3)$$

Further differentiating equation (3) with respect to M, one obtains:

$$\frac{d^2IDD}{dM^2} = 2(I_4 - I_5)\frac{N}{M^3} \quad (4)$$

As I$_4$ >> I$_5$, the curve of IDD with a parameter M is basically an upward facing parabola. Accordingly, the minimum value of IDD is given by the following equation:

$$\frac{dIDD}{dM} = 0 \quad (5)$$

From equations (3) and (5), the following equation is derived:

$$M^2 = (I_4 - I_5)\frac{N}{I_2}$$

Rewriting this in the original form, one obtains:

$$2^{2m} = \frac{I_4 - I_5}{I_2} 2^n \quad (6)$$

$$\therefore m = \frac{1}{2}\left(n + \log_2 \frac{I_4 - I_5}{I_2}\right)$$

The optimum number m of gates of the first-stage decoder can be obtained from equation (6). As the number m must be an integer, the optimum number of gates of the first-stage decoder is determined as the integer nearest to the value obtained from equation (6).

Figure 9:
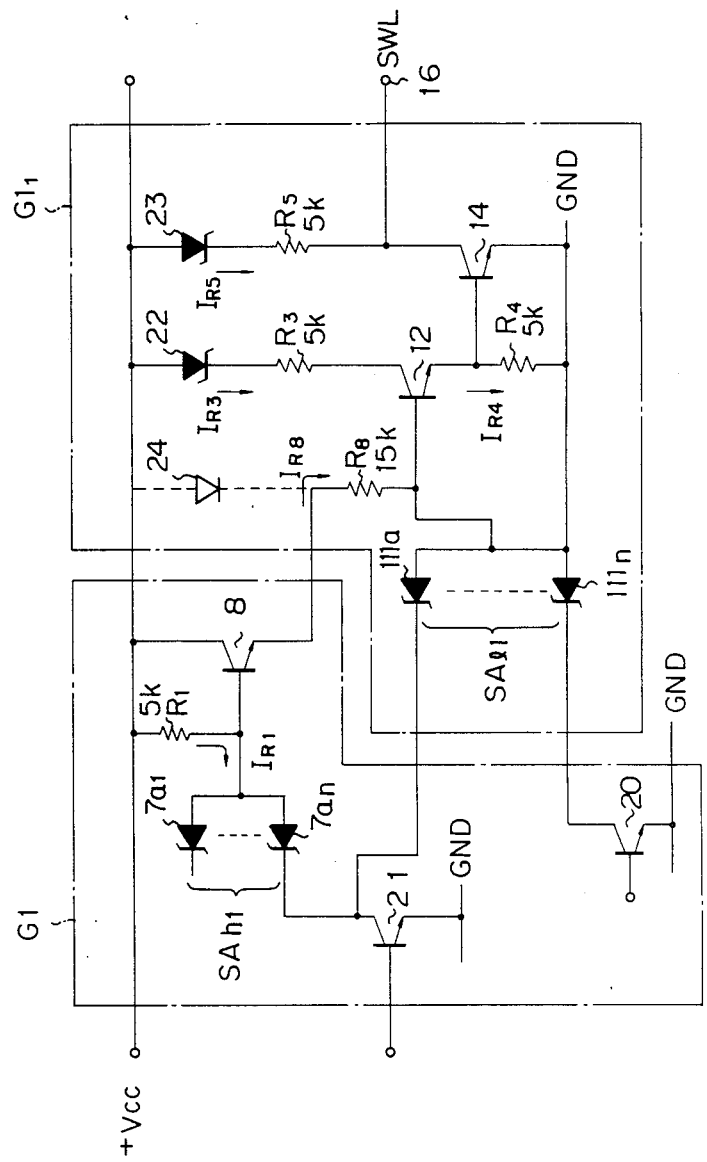
FIG. 9 is a circuit diagram of still another embodiment of the decoder circuit shown in FIG. 3.

The current consumption of the decoder circuit under the optimum number m can be obtained by equation (1). The actual current of the circuit shown in FIG. 9, which is similar to that of FIG. 7, is calculated as an example. In FIG. 9, reference numerals 20 and 21 represent address inverter transistors for pulling the address signal of the first-stage and second-stage decoders to ground. Reference numerals 22 and 23 are diodes connected between the resistors R$_3$ and R$_5$ and the power line Vcc.

In this example, the currents IR$_1$, IR$_B$, IR$_3$, IR$_4$, and IR$_5$, flowing through the resistors R$_1$, R$_B$, R$_3$, R$_4$, and R$_5$, are calculated, assuming the resistances R$_1$=R$_3$=R$_4$=R$_5$=5 kΩ and R$_B$=15 kΩ.

The possible combinations of selection of the gates of the first-stage and second-stage decoders are shown in Table 2.

TABLE 2

| Case | First-stage decoder gate | Second-stage decoder gate |
|---|---|---|
| 1 | Select | Select |
| 2 | Select | Nonselect |
| 3 | Nonselect | Nonselect |

In case 1 of Table 2, the transistor 8 in the FIG. 9 is turned on, whereby the current I$_{RB}$ flows through the resistors R$_B$. At this time, the transistors 20 and 21 are turned off and the transistor 12 in the gate G1$_1$ is turned on, whereby the current I$_{R3}$ flows through the resistor R$_3$. Also, the base of the transistor 14 receives the emitter current of the transistor 12, and the transistor 14 is turned on, whereby the current I$_{R5}$ flows through the resistor R$_5$. Table 3 represents the calculated currents I$_{RB}$, I$_{R3}$, and I$_{R5}$ and the total current I$_3$ under a power (Vcc) of 4.5 V, 5.0 V, and 5.5 V.

TABLE 3

| I (mA) | Vcc (V) | | |
|---|---|---|---|
| | 4.5 | 5.0 | 5.5 |
| $I_{RB}$ | 0.14 | 0.17 | 0.21 |
| $I_{R3}$ | 0.58 | 0.68 | 0.78 |
| $I_{R5}$ | 0.74 | 0.84 | 0.94 |
| SUM $I_3$ | 1.46 | 1.69 | 1.93 |

Next, in the case 2 of Table 2, the transistor 8 shown in FIG. 9 is turned on, the transistor 21 is turned off, and the transistor 20 is turned on. Accordingly, almost all of the current $I_{RB}$ flowing through the resistor $R_B$ flows to ground through the diode 111n, the collector of the transistor 20, and the emitter thereof. Also, the transistor 12 in gate $G1_1$ is turned on, whereby the emitter current $I_{R4}$ of the transistor 12 flows to ground through the resistor $R_4$. Table 4 represents the calculated currents $I_{RB}$ and $I_{R4}$ and the total current $I_4$ under a power (Vcc) of 4.5 V, 5.0 V, and 5.5 V. In this case, the current $I_1$ is zero.

TABLE 4

| I (mA) | Vcc (V) | | |
|---|---|---|---|
| | 4.5 | 5.0 | 5.5 |
| $I_{RB}$ | 0.19 | 0.22 | 0.25 |
| $I_{R4}$ | 0.04 | 0.04 | 0.04 |
| SUM $I_4$ | 0.23 | 0.26 | 0.29 |
| $I_1 = 0$ | | | |

Finally, in the case 3 of Table 2, the transistors 8, 12, and 14 are turned off, however, the transistor 20 and 21 are turned on. Accordingly, the current $I_{R1}$ flowing through the resistor $R_1$, i.e., the current $I_2$, flows to ground through diode $7_{an}$ and the collector and emitter of transistor 21. Table 5 represents the current $I_{R1}$ calculated under a power (Vcc) of 4.5 V, 5.0 V, 5.5 V. The current $I_5$ is zero.

TABLE 5

| I (mA) | Vcc (V) | | |
|---|---|---|---|
| | 4.5 | 5.0 | 5.5 |
| $I_2 = I_{R1}$ | 0.68 | 0.78 | 0.88 |
| $I_5 = 0$ | | | |

In order to obtain the opitimum number m of gates of the first-stage decoder for the number n of gates of the second-stage decoder, the currents $I_1$ to $I_5$ given in Table 3 to 5 are substituted into equation (5).

In order to obtain the minimum current consumption IDD of the decoder circuit, the optimum number m given by the above process is substituted into equation (1). Table 6 represents the current consumption IDD of the decoder circuit in accordance with the above condition.

TABLE 6

| n | m | Vcc 4.5 V IDD (mA) | Vcc 5.0 V IDD | Vcc 5.5 V IDD |
|---|---|---|---|---|
| 4 | 1 | 3.8 | 4.3 | 4.8 |
| 5 | 2 | 5.1 | 5.9 | 6.6 |
| 6 | 2 | 7.0 | 7.9 | 8.9 |
| 7 | 3 | 9.7 | 11.1 | 12.4 |
| 8 | 3 | 13.4 | 15.2 | 17.1 |
| 9 | 4 | 18.8 | 21.5 | 24.1 |

TABLE 6-continued

| n | m | Vcc 4.5 V IDD (mA) | Vcc 5.0 V IDD | Vcc 5.5 V IDD |
|---|---|---|---|---|
| 10 | 4 | 26.2 | 29.8 | 33.4 |

By way of reference in evaluating the present invention, the current consumption of a prior art decoder circuit is shown in Table 7. The current consumption of the prior art decoder circuit is calculated using a circuit similar to that shown in FIG. 9. The circuit is constructed as a single chip.

TABLE 7

| No. of decoder gates | Vcc 4.5 V (mA) | Vcc 5.0 V (mA) | Vcc 5.5 V (mA) |
|---|---|---|---|
| 4 | 4.9 | 5.6 | 6.3 |
| 5 | 8.6 | 9.8 | 10.9 |
| 6 | 16.0 | 18.1 | 20.2 |
| 7 | 30.7 | 34.7 | 38.8 |
| 8 | 60.1 | 68.0 | 75.9 |
| 9 | 119.0 | 134.6 | 150.1 |
| 10 | 236.8 | 267.7 | 298.6 |

Figure 10:
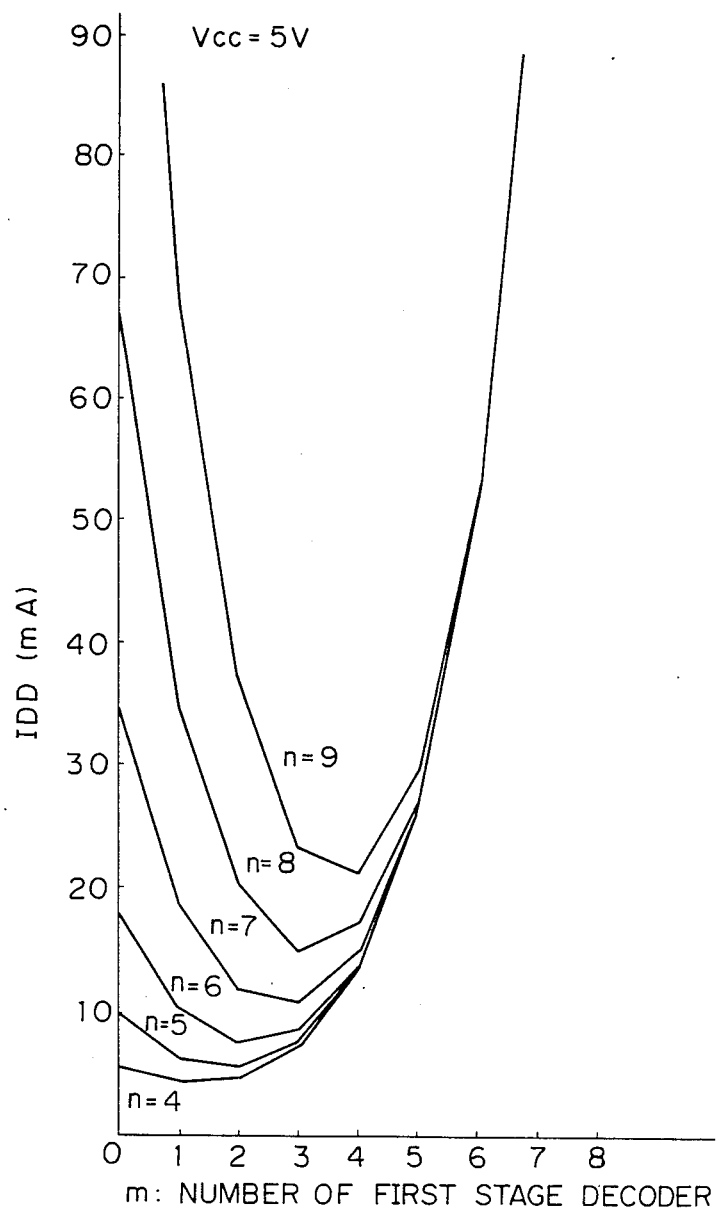
FIG. 10 is a graph of the specific curves concerning the curve shown in FIG. 4.

FIG. 10 is a graph of the current consumption (IDD) curves depending on the number (m) of gates of the first-stage decoder and the number (n) of gates of the second-stage decoder under a power (Vcc) of 5.0 V. From the curves shown in FIG. 10, the optimum combination of m and n can be obtained.

As can be clearly understood from Tables 6 and 7, a decoder circuit having a two-stage construction, as in the present invention, can significantly reduce the power consumption of the decoder circuit compared with the prior art decoder circuit.

For example, when the decoder circuit, in accordance with the present invention, is used in a one-chip programmable read only memory device of 64K bits and there are three gates of the first-stage decoder and eight gates of the second-stage decoder, the current consumption is 15 mA. On the other hand, the prior art decoder circuit consumes 68 mA under the same conditions.

While at the above embodiments were described with reference to the memory system shown in FIGS. 1 and 2, the essence of the present invention is to form a two-stage decoder circuit. The external switching circuits shown in FIGS. 1 and 2 can also be applied to a memory system including a plurality of memory devices in accordance with the present invention.

In addition, a decoder circuit, in accordance with the present invention, may be constructed with three or more stages in consideration of the power consumption and the complexity of the circuit.

According to the present invention, there is provided a semiconductor memory device of considerably reduced power consumption and improved operation time. In addition, the manufacturing process of the semiconductor memory device including the npn transistors, in accordance with the present invention, becomes simple.

What is claimed is:

1. A semiconductor memory device operatively connected to receive address signals, comprising:
    a plurality of memory cells arranged in a matrix having columns and rows; and decoder means, operatively connected to said plurality of memory cells, for selecting one row of said matrix in response to the address signals, said decoder means comprising:

a first-stage decoder having a plurality of first-stage decoding elements having output terminals, said first-stage decoder operatively connected to receive predetermined ones of the address signals; and a second-stage decoder having a plurality of second-stage decoder circuit groups each including a plurality of second-stage decoding elements having output terminals, each of said second-stage decoder circuit groups operatively connected to said corresponding first-stage decoding elements, said second-stage decoder receiving further address signals in addition to said predetermined ones of the address signals connected to said first-stage decoder.

2. A semiconductor memory device according to claim 1, wherein each of said first-stage decoding elements comprises:

a multi-emitter transistor operatively connected to receive said predetermined ones of the address signals at the emitters and having a collector having a collector potential; and a switching element, operatively connected to said multi-emitter transistor and operatively connected to a corresponding one of said second stage decoding elements, turning on when the collector potential of said multi-emitter transistor is high and supplying power to said corresponding one of said second-stage decoding elements.

3. A semiconductor memory device according to claim 1, wherein each of said first-stage decoding elements comprises:

a gate circuit for receiving said predetermined ones of the address signals; and at least one switching element, operatively connected to said gate circuit, turning on when an output of said gate circuit is high and supplying power to said corresponding second-stage decoding elements.

4. A semiconductor memory device according to claim 3, wherein each of said first stage decoding elements further comprises address inverter transistors, operatively connected to receive the address signals, for pulling the address signals to ground.

5. A semiconductor memory device according to claim 3 or 2, wherein said at least one switching element in said first stage decoder comprises an npn transistor.

6. A semiconductor memory device according to claim 3, wherein said gate circuit comprises a plurality of diodes.

7. A semiconductor memory device according to claim 6, in which said plurality of diodes are Schottky barrier diodes.

8. A semiconductor memory device according to claim 1, wherein each of said second-stage decoding elements comprises:

at least one multi-emitter transistor operatively connected to receive address signals at the emitters, having a collector operatively connected to the output terminal of a corresponding one of said first-stage decoding elements, and at least one second switching element having a trigger terminal operatively connected to the output terminal of said corresponding to one of said first-stage decoding elements, having an output terminal operatively connected to said memory cells, for selecting one of the rows of said memory cells when the output terminal of said corresponding one of said first-stage decoding elements is high and the collector potential of said collector of said at least one multi-emitter transistor is high.

9. A semiconductor memory device according to claim 1, wherein each of said second-stage decoding elements comprises:

at least one second-stage gate circuit having an output, for receiving said predetermined ones of the address signals, the output of said at least one second gate circuit being operatively connected to the output of said at least one of said first-stage decoding elements; and at least one second-stage switching element having a trigger terminal operatively connected to the output terminal of a corresponding one of said first-stage decoding elements, the output of said second switching element selecting one of said rows of said memory cells when the output of said corresponding one of said first-stage decoding elements is high and the output of said second gate circuit is high.

10. A semiconductor memory device according to claim 9, wherein said second gate circuit comprises a plurality of diodes.

11. A semiconductor memory device according to claim 10, wherein said plurality of diodes are Schottky barrier diodes.

12. A semiconductor memory device according to claim 8, 9, 10 or 11, wherein said at least one second switching element in said second-stage decoder comprises an npn transistor.

13. A semiconductor memory device according to claim 9, wherein each of said second stage decoding elements of said second-stage decoder further comprises a third gate circuit, operatively connected to said first stage decoder, for receiving said further address signals, the output of said third gate circuit being connected to the output of said at least one second gate circuit.

14. A semiconductor device according to claim 13, wherein each of said second-stage decoding elements comprises:

at least one multi-emitter transistor operatively connected to receive address signals at the emitters, having a collector operatively connected to the output terminal of a corresponding one of said first-stage decoding elements; and at least one second switching element having a trigger terminal operatively connected to the output terminal of said corresponding one of said first stage decoding elements and the collector of said at least one multi-emitter transistor, and having an output terminal operatively connected to said memory cells, for selecting one of said rows of said memory cells when the output terminal of said corresponding one of said first-stage decoding elements is high and the collector potential of said collector of said at least one multi-emitter transistor is high.

15. A semiconductor memory device according to claim 13, wherein said third gate circuit comprises a plurality of diodes.

16. A semiconductor memory device according to claim 15, wherein said plurality of diodes are Schottky barrier diodes.

* * * * *

UNITED STATES PATENT AND TRADEMARK OFFICE
CERTIFICATE OF CORRECTION

PATENT NO. : 4,617,653

DATED : OCTOBER 14, 1986

INVENTOR(S) : YASURO MATSUZAKI ET AL.

It is certified that error appears in the above-identified patent and that said Letters Patent is hereby corrected as shown below:

Col. 2, line 20, "circit" should be --circuit--.

Col. 4, line 17, "XO to X2" should be --$\overline{XO}$ to $\overline{X2}$--.

line 18, "XO to X2" should be --$\overline{\overline{XO}}$ to $\overline{\overline{X2}}$--.

Col. 10, line 46, delete "at".

Signed and Sealed this

Thirteenth Day of January, 1987

*Attest:*

DONALD J. QUIGG

*Attesting Officer*      *Commissioner of Patents and Trademarks*